(12) United States Patent
Dellea et al.

(10) Patent No.: US 10,710,337 B2
(45) Date of Patent: Jul. 14, 2020

(54) METAL AND/OR CERAMIC MICROLATTICE STRUCTURE AND ITS MANUFACTURING METHOD

(71) Applicant: COMMISSARIAT À L'ÉNERGIE ATOMIQUE ET AUX ÉNERGIES ALTERNATIVES, Paris (FR)

(72) Inventors: Olivier Dellea, Grenoble (FR); Olivier Lebaigue, Grenoble (FR); François Tardif, Grenoble (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 0 days.

(21) Appl. No.: 16/268,841

(22) Filed: Feb. 6, 2019

(65) Prior Publication Data
US 2020/0023614 A1    Jan. 23, 2020

(30) Foreign Application Priority Data

Feb. 9, 2018 (FR) ..................... 18 51123

(51) Int. Cl.
*F16F 7/00* (2006.01)
*B32B 15/04* (2006.01)
(Continued)

(52) U.S. Cl.
CPC .............. *B32B 15/04* (2013.01); *B29C 64/10* (2017.08); *B29C 64/20* (2017.08); *B32B 15/02* (2013.01); *B32B 27/12* (2013.01); *C23C 18/30* (2013.01); *C23C 18/32* (2013.01); *C25D 1/02* (2013.01); *D03D 1/00* (2013.01); *G03F 7/0037* (2013.01); *B32B 2262/0207* (2013.01); *B33Y 10/00* (2014.12); *B33Y 30/00* (2014.12); *B33Y 80/00* (2014.12); *C23C 18/1648* (2013.01);

(Continued)

(58) Field of Classification Search
CPC ..... Y10T 428/24083; Y10T 428/12479; Y10T 428/249953; F16F 7/00; B33Y 80/00; C23C 18/1648; C23C 18/1657
See application file for complete search history.

(56) References Cited

U.S. PATENT DOCUMENTS 10,119,589 B2 * 11/2018 Schaedler ................ F16F 7/00
2015/0314588 A1 11/2015 Chousa et al.
(Continued)

FOREIGN PATENT DOCUMENTS

WO  20060130558 A2  12/2006
WO  2013025800 A2  2/2013

OTHER PUBLICATIONS

Sadeghian, Ramin Bana et al. "Macroporous mesh of nanoporous gold in electrochemical monitoring of superoxide release from skeletal muscle cells" In: Biosensors and Bioelectronics, Elsevier Science Ltd. UK, Amsterdam, Jun. 25, 2016, vol. 88, pp. 41-47, XP029804837.

(Continued)

*Primary Examiner* — Alexander S Thomas
(74) *Attorney, Agent, or Firm* — Pearne & Gordon LLP

(57) ABSTRACT

A metal and/or ceramic microlattice structure, comprising an alternation of first layers and of second layers formed by tubes, and interlocking with each other in order to form open loops cooperating two by two in order to form nodes of an articulated/ball-joint nature.

18 Claims, 4 Drawing Sheets

(51) Int. Cl.
*B29C 64/20* (2017.01)
*B29C 64/10* (2017.01)
*B32B 15/02* (2006.01)
*B32B 27/12* (2006.01)
*C23C 18/30* (2006.01)
*C23C 18/32* (2006.01)
*C25D 1/02* (2006.01)
*D03D 1/00* (2006.01)
*G03F 7/00* (2006.01)
*B33Y 10/00* (2015.01)
*B33Y 30/00* (2015.01)
*B33Y 80/00* (2015.01)
*C23C 18/16* (2006.01)

(52) U.S. Cl.
CPC ............ *C23C 18/1657* (2013.01); *F16F 7/00* (2013.01); *Y10T 428/12479* (2015.01); *Y10T 428/24083* (2015.01); *Y10T 428/249953* (2015.04)

(56) References Cited

U.S. PATENT DOCUMENTS

| | | |
|---|---|---|
| 2016/0101432 A1 | 4/2016 | Dellea et al. |
| 2017/0028468 A1 | 2/2017 | Dellea et al. |
| 2018/0045711 A1 | 2/2018 | Roupioz et al. |
| 2018/0339335 A1 | 11/2018 | Aixala et al. |

OTHER PUBLICATIONS

Search Report for French Application No. 1851123 dated Oct. 23, 2018.
U.S. Appl. No. 16/108,541 titled "Structured Element Coated in a Distinguished Manner and Serving As Support for the Flow of Several Fluids" filed Aug. 22, 2018.

\* cited by examiner

METAL AND/OR CERAMIC MICROLATTICE STRUCTURE AND ITS MANUFACTURING METHOD

CROSS-REFERENCE TO RELATED APPLICATIONS

This application claims priority from French Patent Application No. 1851123 filed on Feb. 9, 2018. The content of this application is incorporated herein by reference in its entirety.

BACKGROUND

The invention relates to the field of microlattice structures, made from metal and/or ceramic materials.

The invention has uses in particular in the field of the mechanical industry, in particular for its properties of absorption of kinetic energy. It also has uses in the acoustic and thermal fields.

Microlattice structures, also known by the name "microlattices", emerged after the search for materials capable of meeting the ever-growing requirements of industrial specifications, in particular in terms of lightness and mechanical strength.

Numerous techniques have already been proposed for the creation of these structures, the struts of which converge towards nodes that are considered rigid. Among these techniques, the one involving the drawing, the folding, then the assembly, via soldering, of the primary elements of the structure is noted. Other techniques have also been proposed, such as the method of the wires assembled via soldering on a specific set of tools, additive manufacturing, or photolithography.

In all the cases, the microlattice structure that is obtained has rigid nodes, implying that the struts located between these nodes are deformed only in traction or in compression. This results in a sticky-drawer phenomenon in the struts stressed in compression, which leads to a rapid collapse of the structure under stress.

Thus, there remains a need to improve the design of these microlattice structures, in order for them to have improved mechanical behaviour while being able to be mass produced, using conventional techniques.

BRIEF SUMMARY

In order to meet this need, the object of the invention is a microlattice structure, comprising an alternation of first layers and of second layers in a first direction of the structure;

each first layer comprising a plurality of first tubes each extending in a plane parallel to a first reference plane defined by said first direction of the structure as well as by a second direction orthogonal to the first;

each second layer comprising a plurality of second tubes each extending in a plane parallel to a second reference plane defined by said first direction of the structure as well as by a third direction orthogonal to the first and distinct from the second;

each first tube defining, in said second direction, an alternation of first and second loops open, respectively, in a first heading of the first direction, and in a second heading of the first direction opposite to the first;

each second tube defining, in said third direction, an alternation of third and fourth loops open, respectively, in the first heading of the first direction, and in the second heading of the first direction;

the first and second layers being interlocking with each other in such a way that through each first open loop of each first tube of any given first layer, one of the fourth open loops of one of the second tubes of the second layer directly consecutive to said first given layer in the second heading of the first direction passes, the two loops in question being rigidly connected to each other at their respective loop bottoms in such a way as to form a first microlattice node;

and in such a way that through each second open loop of each first tube of said first given layer, one of the third open loops of one of the second tubes of the second layer directly consecutive to said first given layer in the first heading of the first direction passes, the two loops in question being rigidly connected to each other at their respective loop bottoms in such a way as to form a second microlattice node.

The invention is advantageous first of all in that it has a wide range of elastic deformation in terms of compression, traction and shearing, because of the specific design that was adopted. Indeed, the first and second nodes formed at the points of contact between the open-loop bottoms can behave like articulated/ball-joint nodes. The struts converging at these nodes are thus no longer subject to risks of a sticky-drawer effect, implying that the collapse of the structure is much more progressive than in the creations of the prior art.

For example, the structure according to the invention has a capacity to be elastically deformed that is approximately ten times greater than that found with the creations of the prior art, before reaching the yield point at the nodes.

Moreover, the structure according to the invention can have a very low mass, a high temperature resistance, high permeability, as well as manufacturing compatible with mass production of parts having large volumes, for example greater than a cubic decimetre.

Moreover, the invention preferably provides at least one of the following optional features, taken alone or in combination.

Preferably, the first, second, third and fourth open loops are each in the shape of an arc of a circle, over an angular sector of between 10 and 180° and more preferably between 60 and 75°, and according to a radius of curvature of 0.1 to 10 mm, and more preferably between 1 and 2 mm.

Preferably, in each tube, the open loops are connected to each other by linking struts, preferably straight and having a length between 20 and 100,000 µm, and more preferably between 6 and 12 mm. Alternatively, these linking struts can be curved.

Preferably, said second and third directions are inclined with respect to one another according to an angle of inclination ranging from 10 to 90°, and preferably of approximately 90°.

Preferably, each tube defines a hollow having a diameter between 10 and 1,000 µm.

Preferably, each tube has a wall thickness between 0.01 and 300 µm.

Preferably, each tube has a periodic shape, the elementary pattern of which has a length between 100 and 10,000 µm, and even more preferably between 2 and 4 mm.

Preferably, two directly consecutive first layers or two directly consecutive second layers are spaced apart from each other in the first direction, by a space of between 100 and 10,000 µm and even more preferably between 3 and 5 mm.

Preferably, the structure has a relative density of approximately 0.005 to 0.015, and more preferably of approximately 0.01.

Preferably, the structure is made from a metal material, from a ceramic material, or according to a combination of the two, preferably from at least any one of the following elements:
- nickel, zinc, chromium, tin, copper, gold, silver, platinum, rhodium, aluminium;
- diamond, DLC, alumina, zirconia, tin oxide, zinc oxide, silicon carbide, silicon nitride, titanium nitride, tantalum nitride, tungsten nitride.

The object of the invention is also a method for manufacturing such a metal and/or ceramic microlattice structure, comprising the following steps:
- creation of a textile support having a shape similar to that of the structure to be made;
- deposition of the metal and/or ceramic material onto said textile support; and
- preferably, partial or total elimination of said textile support.

Other advantages and features of the invention will be clear in the non-limiting detailed description below.

BRIEF DESCRIPTION OF THE SEVERAL VIEWS OF THE DRAWING

This description is made in relation to the appended drawings in which.

DETAILED DESCRIPTION

Figure 1:
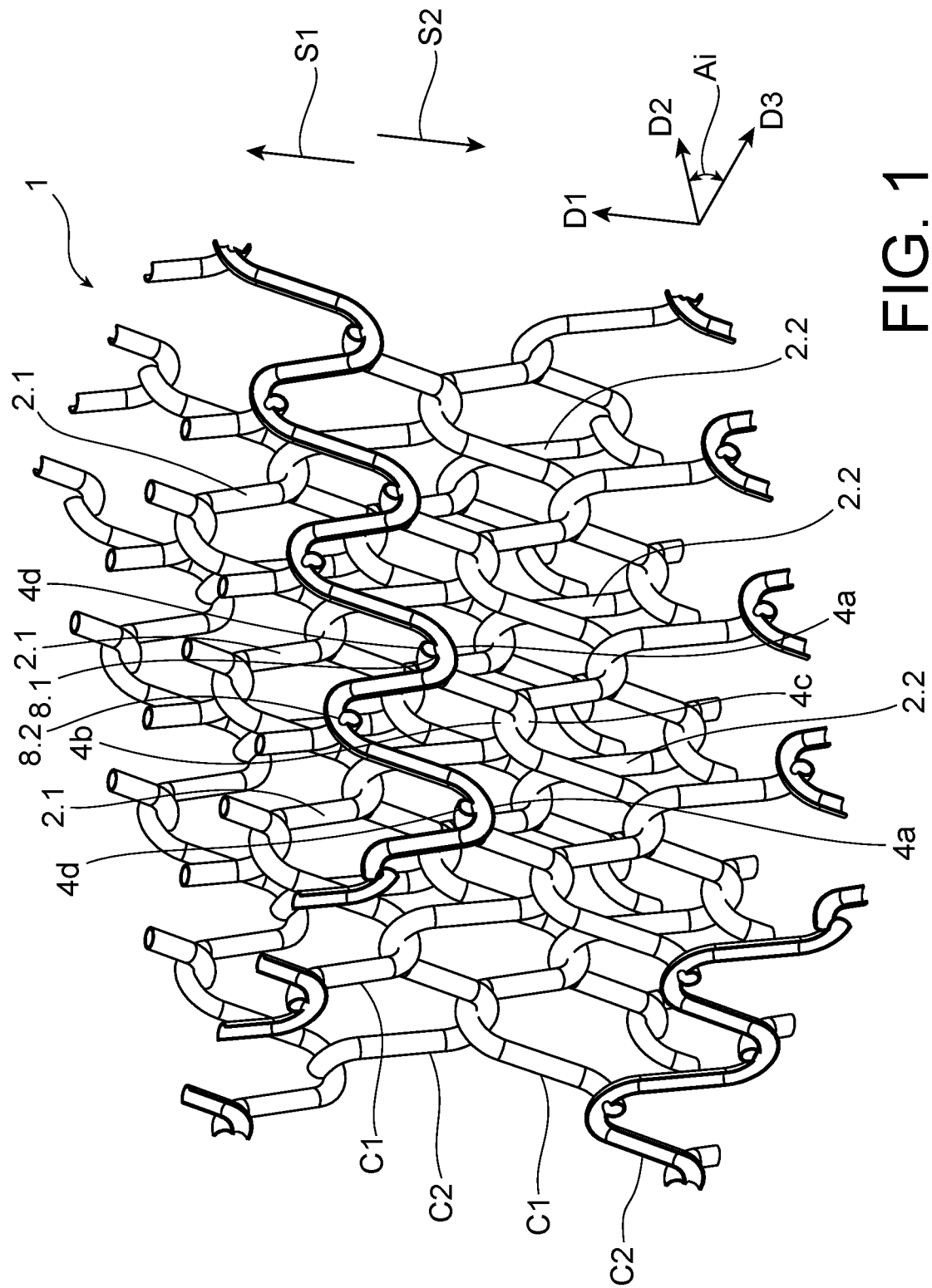
FIG. 1 shows a very large-scale perspective view of a metal microlattice structure, according to a preferred embodiment of the invention.

In reference to FIGS. 1 to 4, a metal microlattice structure 1 is shown, according to a preferred embodiment of the invention. This structure could alternatively be made of ceramic, or from a plurality of metal and ceramic materials, for example in the form of superimposed coatings. An outer coating of polymer material on the tubes forming the structure is also possible, without going beyond the context of the invention.

The interest of this structure lies substantially in its high capacity to absorb mechanical energy, via the elasticity provided by the specific design that will now be described. This design, called layered, is based on the alternation of first layers C1 and of second layers C2, in a first direction D1 of the structure corresponding to the direction of the height in the drawings.

Each first layer C1 comprises a plurality of first tubes 2.1 extending each in a plane parallel to a first reference plane P1, defined by the first direction D1 as well as by a second direction D2 orthogonal to the direction D1. The first parallel tubes 2.1 each define an alternation of first loops 4a and of second loops 4b, in the second direction D2. The first loops 4a are open in a first heading S1 of the first direction D1, while the second loops 4b are open in a second heading S2 of this first direction, the second heading S2 being opposite to the first heading S1 and oriented downwards in the drawings.

Likewise, each second layer C2 comprises a plurality of second tubes 2.2 each extending in a plane parallel to a second reference plane P2, defined by the first direction D1 as well as by a third direction D3 that is also orthogonal to the direction D1, and distinct from the second direction D2. The second parallel tubes 2.2 each define an alternation of third loops 4c and of fourth loops 4d, in the third direction D3. The third loops 4c are open in the first heading S1 of the first direction D1, while the fourth loops 4d are open in the second heading S2 of this first direction.

In each tube 2.1, 2.2, the successive loops are connected by linking struts 6, which have a straight or curved shape. As for the loops 4a-4d, they are preferably in the shape of an arc of a circle, which implies that each tube preferably adopts a shape close to a sinusoidal shape. In this respect, it is indicated that the first and second tubes 2.1, 2.2 each have a periodic shape, respectively having elementary patterns Me1 and Me2 that are preferably identical.

Figure 2:
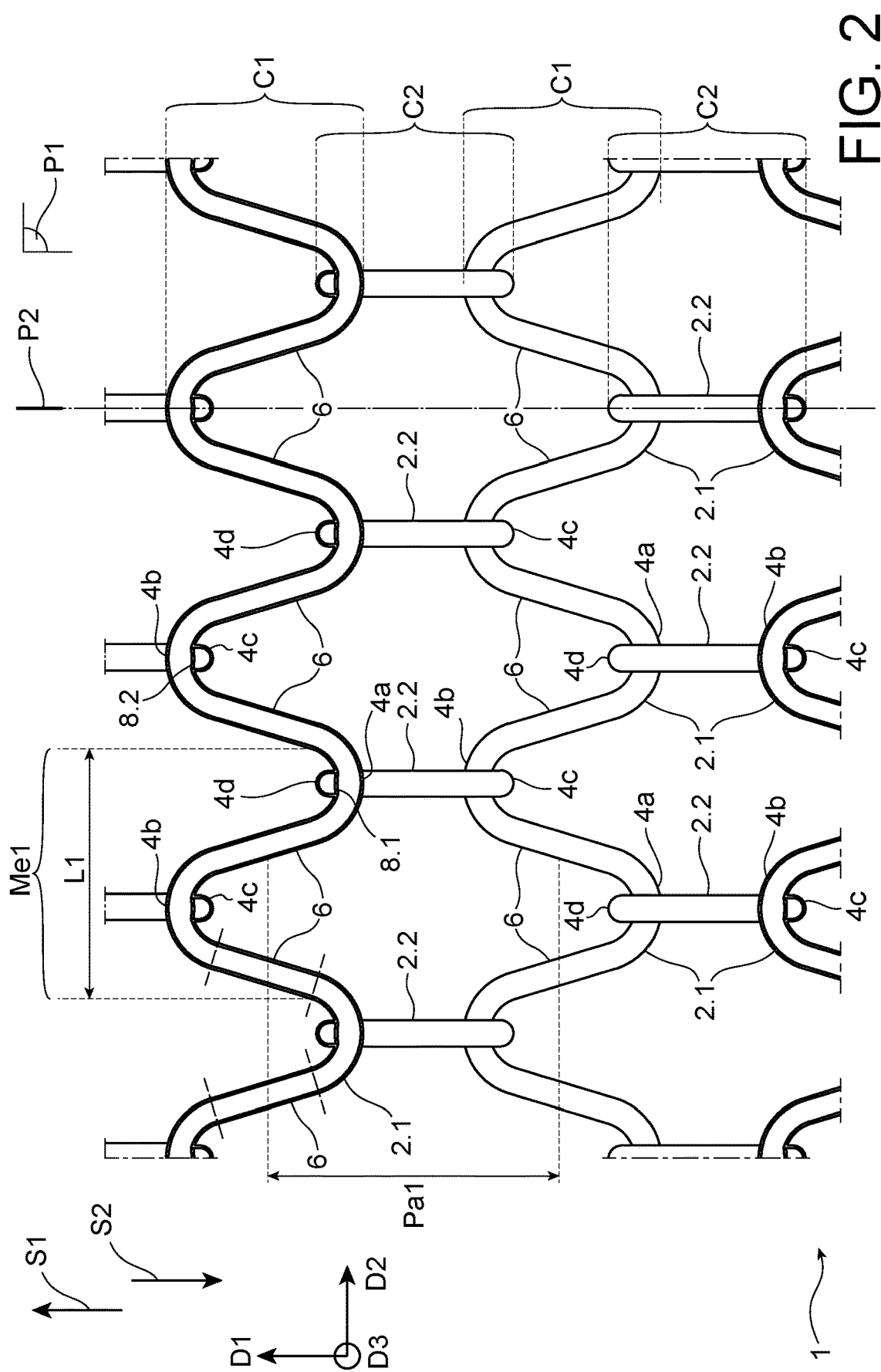
FIG. 2 shows a side view of the structure shown in FIG. 1, according to the third direction of the structure.
Figure 3:
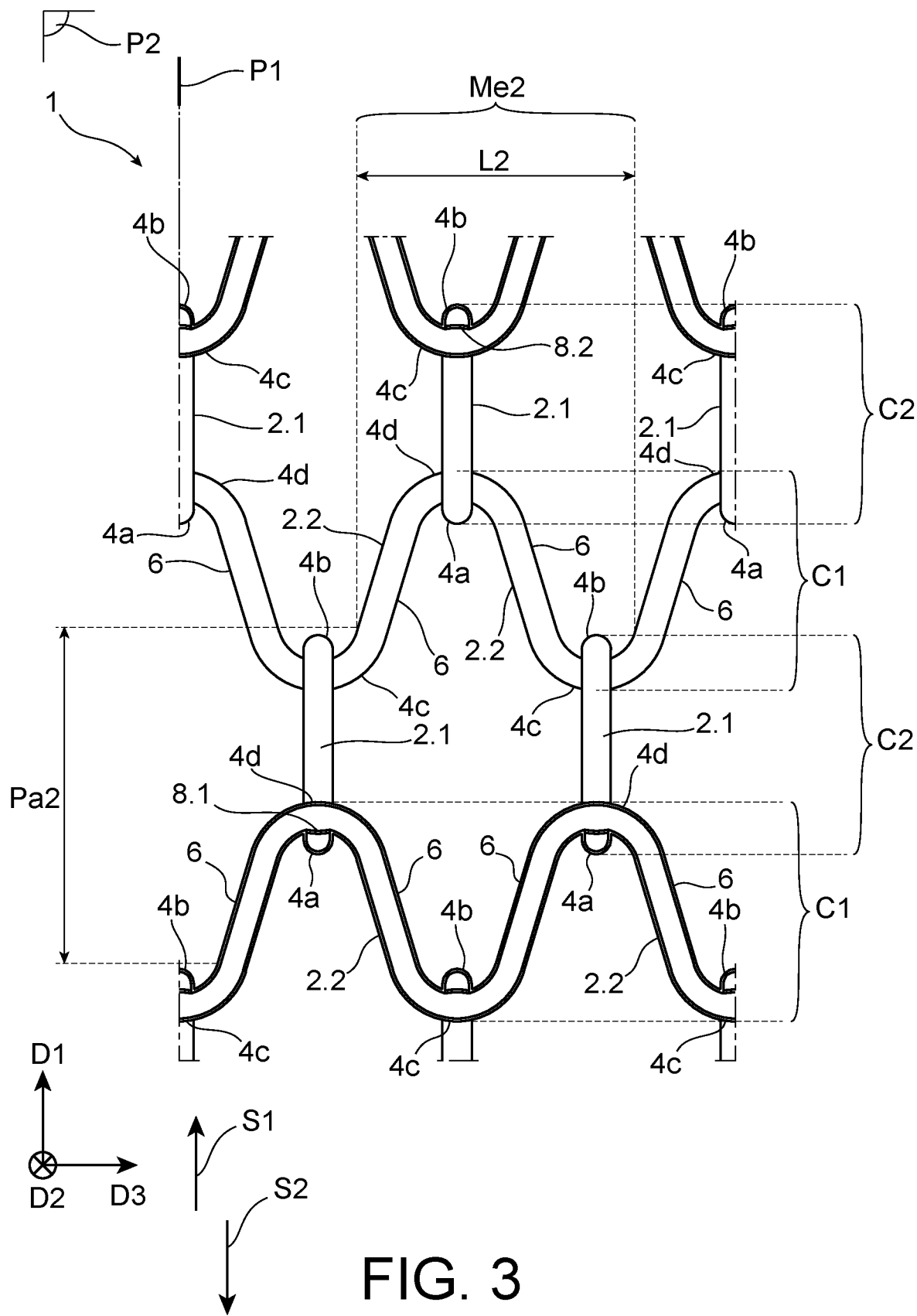
FIG. 3 shows another side view of the structure shown in FIG. 1, according to the second direction of the structure.

As is best visible in FIGS. 2 and 3, for two first layers C1 directly consecutive in the stack in the direction D1, the first tubes 2.1 of one of these two layers C1 are offset by a value of a half-length of the elementary pattern Me1 with respect to the tubes 2.1 of the other layer C1. Also, for two second layers C2 directly consecutive in the stack in the direction D1, the second tubes 2.2 of one of these two layers C2 are offset by a value of a half-length of the elementary pattern Me2 with respect to the tubes 2.2 of the other layer C1. Consequently, all of the first tubes 2.1 of the first layers C1 are arranged in staggered rows, just like the assembly formed by the second tubes 2.2 of the second layers C2.

In this preferred embodiment, the second and third directions D2, D3 are orthogonal to each other, in such a way that an angle of inclination Ai of approximately 90° is chosen between these two directions. Nevertheless, the angle Ai could have a different value, for example between 10 and 90°.

One of the particularities of the invention lies in the interlocking of the alternating layers C1, C2. Indeed, through each first open loop 4a of each first tube 2.1 of any given first layer C1, one of the fourth open loops 4d of one of the second tubes 2.2 of the second layer directly consecutive, in the second heading S2, passes. The two loops 4a, 4d that pass through each other orthogonally here are rigidly connected to each other at their respective loop bottoms, in such a way as to form a first microlattice node, labelled 8.1 in FIGS. 1 and 4. This first node 8.1, formed by the point of contact inside the two loops 4a, 4d, thus has a flexibility giving it an articulated/ball-joint nature. Each of these loops 4a, 4d forms two struts defined by the node 8.1, and it is therefore four struts that extend here in two orthogonal planes, from this first node 8.1.

Likewise, through each second open loop 4b of each first tube 2.1 of the any given first layer C1, one of the third open loops 4c of one of the second tubes 2.2 of the second layer directly consecutive, in the first heading S1, passes. The two loops 4b, 4c that pass through each other here orthogonally are rigidly connected to each other at their respective loop bottoms, in such a way as to form a second microlattice node, labelled 8.2 in FIGS. 1 and 4. This first node 8.2, formed by the point of contact inside the two loops 4b, 4c, thus has a flexibility giving it an articulated/ball-joint nature. Each of these loops 4b, 4c forms two struts defined by the node 8.2, and it is therefore four struts that extend here in two orthogonal planes, from this second node 8.2.

Figure 4:
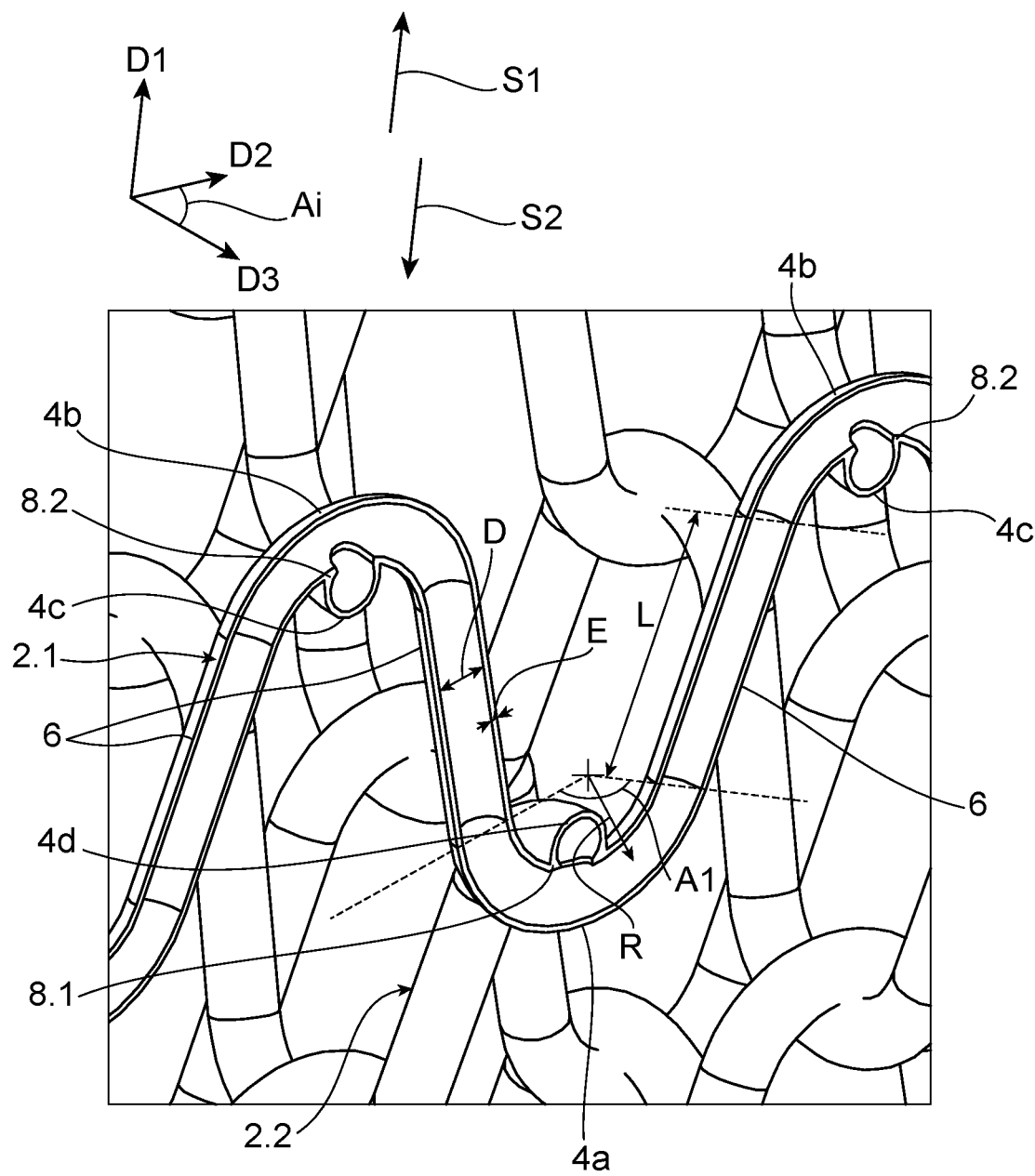
FIG. 4 is an enlarged perspective view of a portion of the structure shown in FIG. 1.

In reference now to FIG. 4, the dimensioning of the microlattice structure 1, the volume of which can exceed a cubic decimetre, will now be described. First of all, the angular sector A1 according to which each loop 4a-4d extends is between 10 and 180°, but preferably chosen between 60 and 75°. The radius of curvature R of these arcs of a circle is between 0.1 and 10 mm, and more preferably between 1 and 2 mm. The length L of each linking strut 6, connecting two consecutive loops of each tube, is approximately 20 and 100,000 µm, and more preferably between 6 and 12 mm.

Moreover, each tube 2.1, 2.2 defines a hollow having a diameter D between 10 and 1,000 µm, and the wall thickness E is between 0.01 and 300 µm. Moreover, the two directly consecutive first layers C1 are spaced apart from each other in the first direction D1, by a space Pa1 of between 100 and 10,000 µm, and preferably between 3 and 5 mm. This space Pa1 is referenced in FIG. 2, while a space Pa2 between two directly consecutive second layers C2, referenced in FIG. 3, has a value identical to the space Pa1. Finally, the elementary patterns Me1, Me2 respectively have a length L1, L2 between 100 and 10,000 µm, and preferably between 2 and 4 mm.

The microlattice structure 1 is made from a metal material, preferably from at least any one of the following elements out of nickel, zinc, chromium, tin, copper, gold, silver, platinum, rhodium, aluminium.

Via the specific design of the invention, it is possible to obtain a structure having the following technical characteristics:
- density from 3 to 300 kg·m$^{-3}$;
- relative density of approximately 0.005 to 0.015, and more preferably of approximately 0.01;
- elastic deformation >40%;
- range of temperature of use from −200 to +400° C.;
- open porosity >90%;
- thermal conductivity from 0.012 to 1.2 W·m$^{-1}$·K$^{-1}$ (under vacuum)

A preferred method for manufacturing the microlattice structure 1, which allows mass production, will now be described.

First of all, a textile support having a shape similar to that of the structure 1 to be manufactured is made. This textile support can be of the knitted fabric type, and made from a polymer material.

This textile support is then subjected to a deposition of the metal material, for example nickel. In order to carry out this deposition all around the textile support, various techniques can be used. For example, the chemical deposition of nickel onto the textile forming the substrate is a possible possibility.

To do this, first, degreasing of the textile support is carried out, via rinsing in a solvent of the isopropanol (IPA) type. Then, a catalyst is deposited on the textile support, via immersion in a bath of palladium acetate diluted in the isopropanol. Drying is then carried out in an oven at 70° C. for 1 h. Finally, the deposition of Nickel is carried out by immersion in a bath of NIPOL MPB at 80-86° C. for several hours. NIPOL MBP is a medium-phosphorus chemical-nickel method allowing the deposition of brilliant alloys on substrates. This technology is in particular proposed by the company Technic France®.

Other techniques of depositions are nevertheless possible, such as electrophoretic deposition, or the conventional techniques of CVD and PVD.

Finally, a last step of the manufacturing method lies in the total or partial elimination of the polymer textile support, via conventional techniques of the type sodium hydroxide, organic solvents, plasma, or pyrolysis.

For example, this chemical elimination is carried out via immersion of the sample in a bath of NaOH at 60° C., for 24 h.

However, this elimination step remains optional, since the textile support can be preserved. Thus, the tubes of the structure thus manufactured can be hollow, entirely filled, or partly filled, preferably with a polymer material that was used for the formation of the tubes.

Of course, various modifications can be made by a person skilled in the art to the invention that has just been described only as examples, and the scope of which is defined by the appended claims.

The invention claimed is:

1. Metal and/or ceramic microlattice structure (1), comprising an alternation of first layers (C1) and of second layers (C2) in a first direction (D1) of the structure;
each first layer (C1) comprising a plurality of first tubes (2.1) each extending in a plane parallel to a first reference plane (P1) defined by said first direction (D1) of the structure as well as by a second direction (D2) orthogonal to the first;
each second layer (C2) comprising a plurality of second tubes (2.2) each extending in a plane parallel to a second reference plane (P2) defined by said first direction (D1) of the structure as well as by a third direction (D3) orthogonal to the first and distinct from the second;
each first tube (2.1) defining, in said second direction (D2), an alternation of first and second loops (4 *a*, 4 *b*) open, respectively, in a first heading (S1) of the first direction, and in a second heading (S2) of the first direction opposite to the first;
each second tube (2.2) defining, in said third direction (D3), an alternation of third and fourth loops (4 *c*, 4 *d*) open, respectively, in the first heading (S1) of the first direction, and in the second heading (S2) of the first direction;
the first and second layers being interlocking with each other in such a way that through each first open loop (4 *a*) of each first tube (2.1) of any given first layer (C1), one of the fourth open loops (4 *d*) of one of the second tubes (2.2) of the second layer (C2) directly consecutive to said first given layer in the second heading (S2) of the first direction passes, the two loops in question (4 *a*, 4 *d*) being rigidly connected to each other at their respective loop bottoms in such a way as to form a first microlattice node (8.1);
and in such a way that through each second open loop (4 *b*) of each first tube (2.1) of said first given layer (C1), one of the third open loops (4 *c*) of one of the second tubes (2.2) of the second layer (C2) directly consecutive to said first given layer in the first heading (S1) of the first direction passes, the two loops in question (4 *b*, 4 *c*) being rigidly connected to each other at their respective loop bottoms in such a way as to form a second microlattice node (8.2).

2. Structure according to claim 1, characterised in that the first, second, third and fourth open loops (4 *a*-4 *d*) are each in the shape of an arc of a circle, over an angular sector (A1) of between 10 and 180°, and according to a radius of curvature (R) of 0.1 to 10 mm.

3. Structure according to claim 2, wherein the arc of the circle is between 10 and 180°, and the radius of curvature is between 1 and 2 mm.

4. Structure according to claim 1, characterised in that in each tube (2.1, 2.2), the open loops (4 *a*-4 *d*) are connected to each other by linking struts (6) having a length (L) between 20 and 100,000 µm.

5. Structure according to claim 4, wherein the linking struts have a length between 6 and 12 mm.

6. Structure according to claim 1, characterised in that said second and third directions (D2, D3) are inclined with respect to one another according to an angle of inclination (Ai) ranging from 10 to 90°.

7. Structure according to claim 6, wherein the angle of inclination is approximately 90°.

8. Structure according to claim 1, characterised in that each tube (2.1, 2.2) defines a hollow having a diameter (D) between 10 and 1000 μm.

9. Structure according to claim 1, characterised in that each tube (2.1, 2.2) has a wall thickness (E) between 0.01 and 300 μm.

10. Structure according to claim 1, characterised in that each tube (2.1, 2.2) has a periodic shape, the elementary pattern (Me1, Me2) of which has a length (L1, L2) between 100 and 10,000 μm.

11. Structure according to claim 10, wherein the elementary pattern has a length between 2 and 4 mm.

12. Structure according to claim 1, characterised in that two directly consecutive first layers (C1) or two directly consecutive second layers (C2) are spaced apart from each other in the first direction (D1), by a space (Pa1, Pa2) of between 100 and 10,000 μm.

13. Structure according to claim 12, wherein the two directly consecutive first layers or two directly consecutive second layers are spaced apart from each other in the first direction by a space of between 3 and 5 mm.

14. Structure according to claim 1, characterised in that it has a relative density of approximately 0.005 to 0.015.

15. Structure according to claim 14, wherein the relative density is approximately 0.01.

16. Structure according to claim 1, characterised in that it is made from a metal material, from a ceramic material, or according to a combination of the two.

17. Method for manufacturing a metal and/or ceramic microlattice structure (1) according to claim 16, characterised in that it comprises the following steps:
creation of a textile support having a shape similar to that of the structure to be made;
deposition of the metal and/or ceramic material onto said textile support.

18. Structure according to claim 16, wherein the material(s) is(are) selected from nickel, zinc, chromium, tin, copper, gold, silver, platinum, rhodium, aluminium, diamond, DLC, alumina, zirconia, tin oxide, zinc oxide, silicon carbide, silicon nitride, titanium nitride, tantalum nitride, tungsten nitride.

* * * * *